US012787273B2

(12) United States Patent
Zhang et al.

(10) Patent No.: US 12,787,273 B2
(45) Date of Patent: Nov. 3, 2026

(54) NONVOLATILE MEMORY WITH UV ATTENUATING STRUCTURAL ARRANGEMENT

(71) Applicant: TEXAS INSTRUMENTS INCORPORATED, Dallas, TX (US)

(72) Inventors: Zeng Zhang, Allen, TX (US); Jack Qian, Plano, TX (US); Keith Jarreau, Dallas, TX (US); Tamer San, Plano, TX (US); Mark Eskew, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 489 days.

(21) Appl. No.: 18/193,899

(22) Filed: Mar. 31, 2023

(65) Prior Publication Data

US 2024/0334692 A1 Oct. 3, 2024

(51) Int. Cl.

| | |
|---|---|
| ***H10B 41/30*** | (2023.01) |
| ***H10B 20/25*** | (2023.01) |
| ***H10B 41/10*** | (2023.01) |
| ***H10D 30/68*** | (2025.01) |

(52) U.S. Cl.

CPC ............. *H10B 41/30* (2023.02); *H10B 20/25* (2023.02); *H10B 41/10* (2023.02); *H10D 30/68* (2025.01)

(58) Field of Classification Search

CPC ........ H10B 41/30; H10B 20/25; H10B 41/10; H10D 30/68

See application file for complete search history.

(56) References Cited

U.S. PATENT DOCUMENTS

| | | | | |
|---|---|---|---|---|
| 9,978,603 B2 * | 5/2018 | Wu | H10D 64/035 | |
| 2002/0036317 A1 * | 3/2002 | Matsui | H10B 41/40 | 257/315 |
| 2015/0084111 A1 * | 3/2015 | Wu | H10B 41/30 | 257/316 |
| 2017/0033120 A1 * | 2/2017 | Lee | H10B 43/27 | |
| 2017/0243946 A1 * | 8/2017 | Pan | H10D 30/6892 | |
| 2023/0397426 A1 * | 12/2023 | Jiang | H10B 51/20 | |

OTHER PUBLICATIONS

Wang et al. "Organic floating-gate transistor memory based on the structure of pentacene/nanoparticle-Al/Al2O3," American Institute of Physics, 2010) (Year: 2010).*

* cited by examiner

*Primary Examiner* — Yasser A Abdelaziez

(74) *Attorney, Agent, or Firm* — Andrew R. Ralston; Charles F. Koch

(57) ABSTRACT

An integrated circuit comprises a transistor extending into a semiconductor substrate and having a gate structure having major and minor axes parallel to a surface of the semiconductor substrate, and a UV-opaque sheet structure vertically spaced apart from a top surface of the gate structure by a first distance and including an opening, the opening having first and second sides about parallel to the major axis, at least one of the first and second sides laterally spaced apart from a corresponding side of the gate structure by a second distance that is less than or equal to the first distance.

20 Claims, 12 Drawing Sheets

NONVOLATILE MEMORY WITH UV ATTENUATING STRUCTURAL ARRANGEMENT

FIELD OF THE DISCLOSURE

Disclosed implementations relate generally to the field of semiconductor memory and fabrication. More particularly, but not exclusively, the disclosed implementations relate to nonvolatile memory.

BACKGROUND

A non-volatile-memory (NVM) bitcell is an electronic element that is configured to store information. A voltage or current derived from a charge storage state of the bitcell can be used to discriminate between logic levels of the bitcell, such as a logic low level ("0") or a logic high level ("1"). This stored value may sometimes be referred to as information (or a bit). Because NVM bitcells may be used as a storage medium that retains the information for a long period of time even after power is removed (e.g., tens or hundreds of years), it is important to ensure that data retention performance of the NVM bitcells is not compromised.

SUMMARY

The following presents a simplified summary in order to provide a basic understanding of some examples of the present disclosure. This summary is not an extensive overview of the examples, and is neither intended to identify key or critical elements of the examples, nor to delineate the scope thereof. Rather, the primary purpose of the summary is to present some concepts of the present disclosure in a simplified form as a prelude to a more detailed description that is presented in subsequent sections further below.

Examples of the present disclosure are directed to a nonvolatile memory (NVM) device having one or more UV-opaque structures associated with a floating gate (FG) storage cell for modulating the amount of UV radiation used in erasing accumulated charge in the FG storage cell in order to ensure that data retention performance of the FG storage cells is not compromised.

In one example, an integrated circuit (IC) is disclosed, which comprises, inter alia, a transistor extending into a semiconductor substrate and having a gate structure having major and minor axes parallel to a surface of the semiconductor substrate, and a UV-opaque sheet structure vertically spaced apart from a top surface of the gate structure by a first distance and including an opening, the opening having first and second sides about parallel to the major axis, at least one of the first and second sides laterally spaced apart from a corresponding side of the gate structure by a second distance that is less than or equal to the first distance.

In one example, an IC is disclosed, comprising, inter alia, a plurality of floating gate memory cells organized in a bitcell array; and a metal sheet structure over the bitcell array, the metal sheet structure including a plurality of apertures corresponding to the plurality of floating gate memory cells, each aperture positioned above and having an inside edge surrounding a respective gate structure of a corresponding floating gate memory cell, the inside edge of each aperture laterally spaced apart from a perimeter of the respective gate structure by a horizontal distance greater than zero, e.g., measured outward from the perimeter of the respective gate structure.

In one example, an IC is disclosed, comprising, inter alia, a plurality of floating gate memory cells organized in a bitcell array; and a plurality of metal layer structures corresponding to the plurality of floating gate memory cells, each metal layer structure positioned above and at least partially surrounding a respective gate structure of a corresponding floating gate memory cell, each metal layer structure having an edge laterally spaced apart from an edge of the respective gate structure by a horizontal distance greater than zero, e.g., measured outward from the edge of the respective gate structure, and less than approximately 20% of a vertical distance between a top surface of the respective gate structure and a corresponding metal layer structure.

In some examples, methods of fabricating one or more of the foregoing IC devices having a nonvolatile memory are disclosed. In one arrangement, an example method may comprise, inter alia, forming a plurality of floating gate memory cells in a semiconductor substrate, the floating gate memory cells organized in a bitcell array; and forming a plurality of metal layer structures corresponding to the plurality of floating gate memory cells, each metal layer structure positioned above and at least partially surrounding a respective gate structure of a corresponding floating gate memory cell, each metal layer structure having an edge laterally spaced apart from an edge of the respective gate structure by a horizontal distance greater than zero, e.g., measured outward from the edge of the respective gate structure, and less than approximately 20% of a vertical distance between a top surface of the respective gate structure and a corresponding metal layer structure.

BRIEF DESCRIPTION OF DRAWINGS

Implementations of the present disclosure are illustrated by way of example, and not by way of limitation, in the Figures of the accompanying drawings. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing Figures in which:

DETAILED DESCRIPTION

Figure 1:
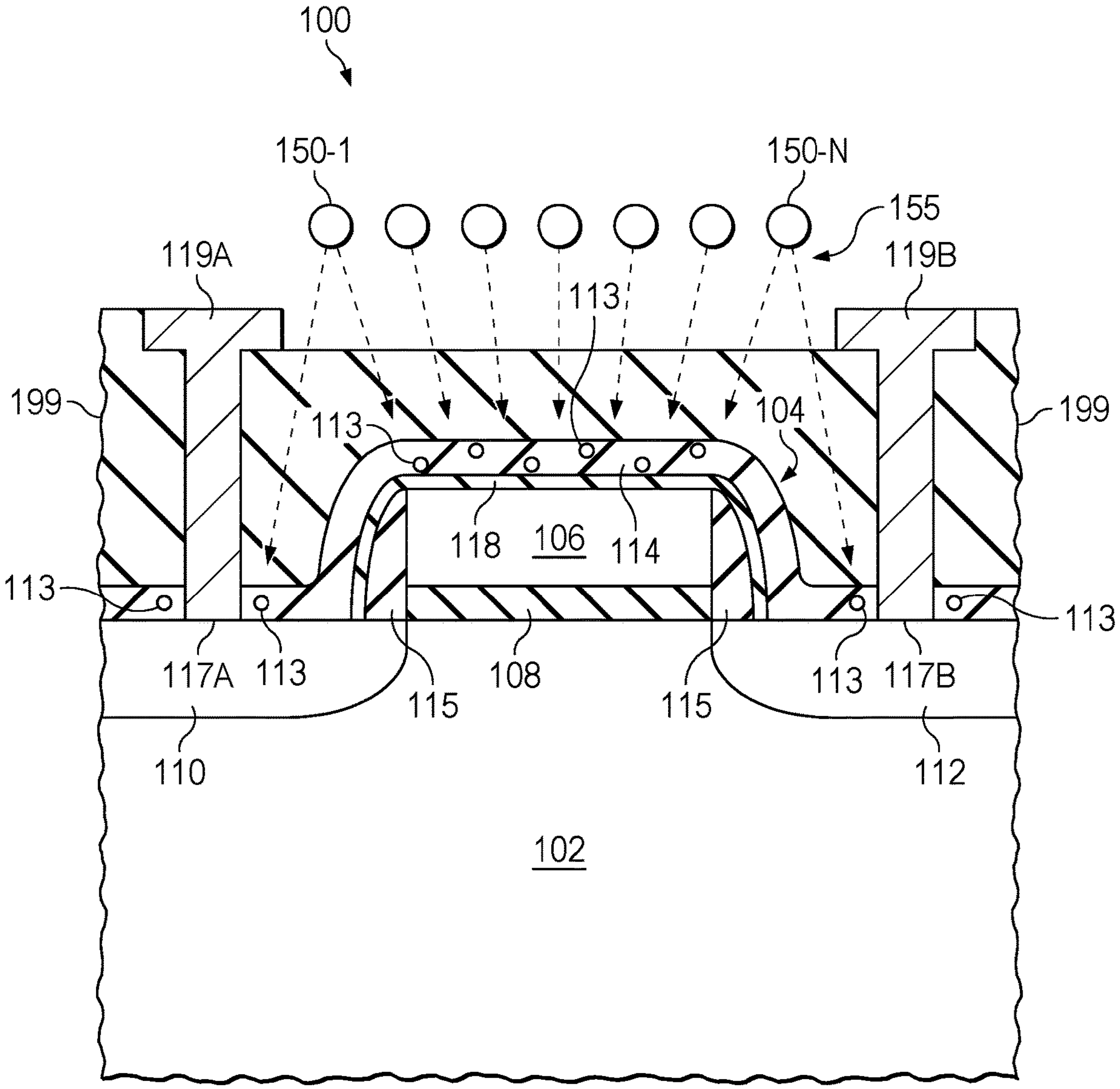
FIGS. 1 and 2 depict cross-sectional views of representative floating gate (FG) cells undergoing UV erasure for charge removal according to some example arrangements.

Examples of the disclosure are described with reference to the attached Figures wherein like reference numerals are generally utilized to refer to like elements. The Figures are not drawn to scale and they are provided merely to illustrate examples. Numerous specific details, relationships, and methods are set forth below to provide an understanding of one or more examples. However, it should be understood that some examples may be practiced without such specific details. In other instances, well-known circuits, subsystems, components, structures and techniques have not been shown in detail in order not to obscure the understanding of the examples. Accordingly, it will be appreciated by one skilled in the art that the examples of the present disclosure may be practiced without such specific components.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, between two or more elements that are coupled with each other. Further, in one or more examples set forth herein, generally speaking, an element, component or module may be configured to perform a function if the element may be programmed for performing or otherwise structurally arranged to perform that function.

Without limitation, examples relating to improving data retention of NVM bitcells will be set forth below in the context of floating-gate (FG)-based bitcell architectures, wherein a polysilicon floating gate structure of a bitcell may be programmed by developing a charge therein for storing data.

In general, storage of information in NVM may be effectuated using changes in the floating gate characteristics of the bitcells. The threshold voltage (VT) of a floating-gate type transistor bitcell may change because of the presence or absence of a charge trapped in its floating gate due to electrical isolation. The trapped charge alters the threshold voltage (relative to the unchanged threshold voltage) of the floating-gate transistor bitcell. For instance, in an example NMOS-based NVM implementation, the threshold voltage is increased when electrons are introduced into the floating gate (FG) structure of the bitcell (e.g., a "programmed" bitcell). On the other hand, the threshold voltage is decreased when electrons are depleted in the floating gate of an NMOS bitcell (e.g., an "erased" bitcell). Accordingly, in a read operation, the NMOS bitcell is conductive in an erased state (e.g., indicating a logic "1") and nonconductive in a programmed state (e.g., indicating a logic "0"), wherein each state is operative for generating a corresponding read current (IREAD) that is provided to a sense amplifier for sensing the data. In an example arrangement, the sense amplifier may be configured to determine the data relative to another current, referred to as a reference current (IREF). In PMOS-based NVM, these relationships are opposite, in that the PMOS bitcells are conductive in programmed state and non-conducting in erased state.

Depending on implementation, a semiconductor manufacturing process for fabricating ICs, e.g., including an NVM array, may comprise a fabrication flow involving various front-end-of-line (FEOL) and back-end-of-line (BEOL) stages, which may include one or more thin-film and/or thick-film processing/deposition stages, one or more photolithography stages, diffusion/implant stages, etching stages, chemical-mechanical polishing (CMP) stages, metallization stages, bumping and wire-bonding stages, etc., among others. At an example process stage, a material layer of the semiconductor wafer may be processed so as to alter one or more physical and/or electrical characteristics of the material layer. In some examples, a process stage may add to or subtract from a material layer, e.g., deposition of conductive layers, nonconductive or dielectric layers, etching or polishing of layers, and the like.

During the fabrication of IC devices including NVM, a UV illumination process may be implemented at the end of BEOL flow in order to remove any charge that may have been unintentionally introduced into the FG structures of the bitcells during manufacturing due to, for instance, oxidation steps, plasma etch processes, high temperature $H_2/N_2$ anneal processes, etc., so that the NVM is in condition for programming with appropriate data, e.g., either in factory or in the field. Whereas higher UV dosages may be applied to ensure that the accumulated charge is erased from the FG cells, exposing process wafers with high UV doses may activate charge traps in nitride layers surrounding or disposed in the vicinity of the FG cells that may be provided in some example process architectures. In some arrangements, the activated nitride charge traps may cause degradation of data programmed into the FG cells. Further, the activation of nitride charge traps due to high dose UV exposure may also compromise the integrity of metal contact structures that have a nitride layer separating the metallic portions from the substrate material, e.g., diffusion areas in a process wafer substrate. On the other hand, reducing the UV doses may be suboptimal with respect to the erasure of unwanted charge accumulated in the FG structures during processing. Additionally, reduced UV doses may also negatively impact the parametric characteristics of other non-memory devices in an IC, such as, e.g., drain extended MOS (DEMOS) devices, bipolar junction transistors (BJTs), resistors, and the like. For example, reducing the UV dosage may induce a large shift in the high temperature reverse bias (HTRB) of DEMOS devices, which is undesirable especially in high power applications.

Examples described herein recognize the foregoing competing design goals with respect to UV illumination of process wafers including ICs with NVM. Accordingly, examples of the present disclosure may be configured to provide one or more UV-opaque structures formed relative to the FG cells of an NVM array for effectuating a configurable UV dosage modulation scheme that may be optimized for different NVM products and process technologies. In some examples, the UV-opaque structures may be geometrically/spatially configured to provide a "UV shadow" with respect to the FG cells for controlling the amount of UV illumination or radiation reaching the FG storage structures thereof. It should be appreciated that while the examples of the present disclosure may be expected to provide various tangible improvements over baseline implementations that aim to modulate the quality of the nitride layer itself to mitigate the charge loss induced by UV-nitride interactions, no particular result is a requirement unless explicitly recited in a particular claim appended hereto.

Figure 2:
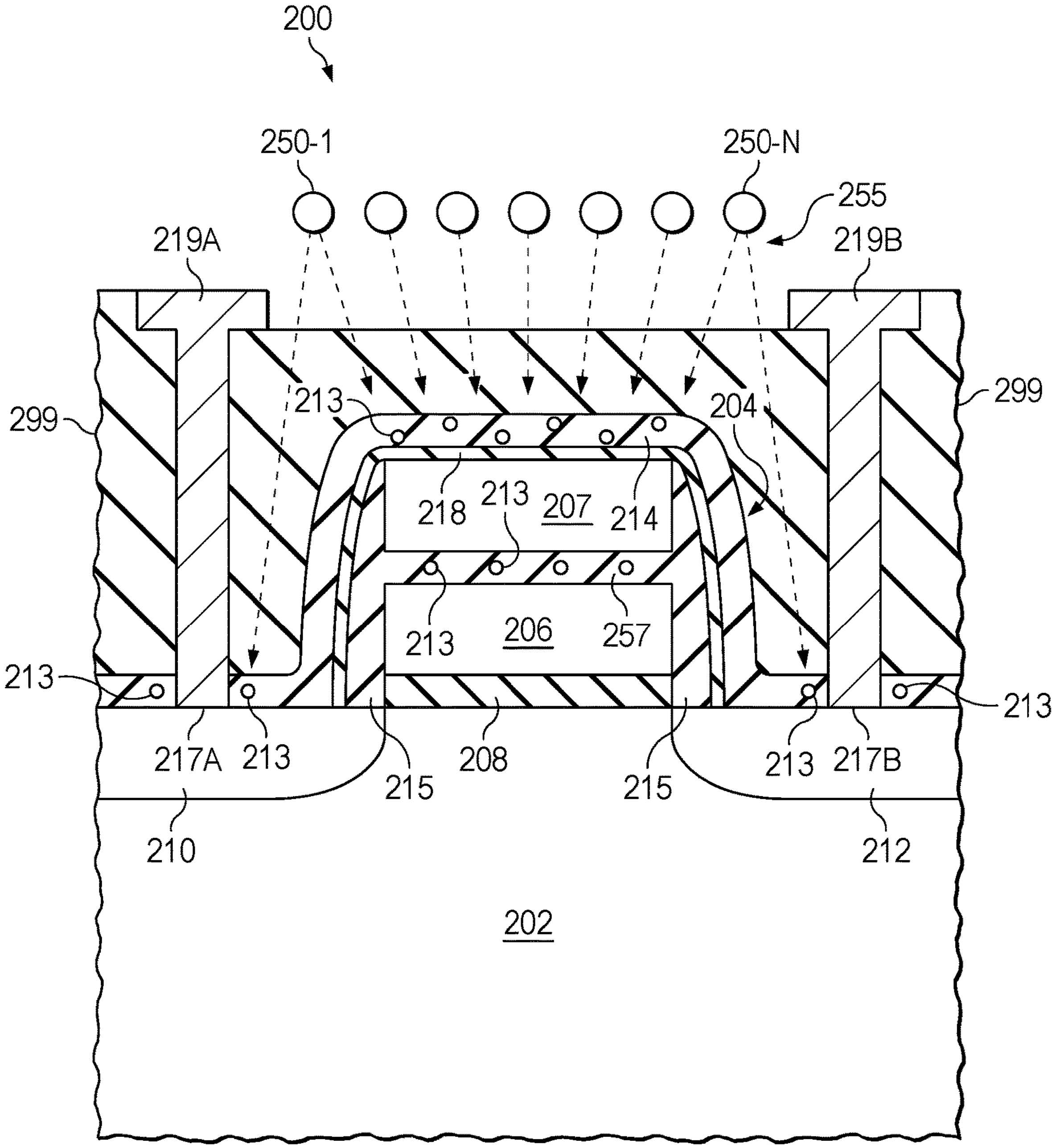

FIGS. 1 and 2 depict cross-sectional views of representative FG cells undergoing UV erasure for charge removal, wherein UV-opaque structures for modulating UV dosage levels may be implemented according to some example arrangements. In particular, reference number 100 shown in FIG. 1 generally refers to a cross-sectional view of a single polysilicon ("poly") gate storage element of an NVM component comprising a memory bitcell that may be fabricated according to known or heretofore unknown processes. In some examples the memory bitcell is a one-time programmable (OTP) memory storage bell. For sake of simplicity, views of an access/select transistor and/or other auxiliary transistors that may be associated with an OTP storage element (which may depend on the particular OTP bitcell architecture) are not shown in the cross-sectional view 100 of FIG. 1. By way of illustration, a single poly storage element or storage cell 104 having a poly gate structure 106 and associated source/drain regions 110, 112, may be fabricated in a semiconductor substrate 102 using a suitable FEOL flow. For example, after defining active regions in or on the semiconductor substrate 102 by a device isolation process, a gate oxide layer 108 having a suitable thickness (e.g., 1 nm to 30 nm or more depending on implementation) may be formed on an OTP cell region defined an active region of the substrate 102. A conductive layer such as a doped poly layer formed over the gate oxide layer 108 may be patterned to form the poly gate structure 106 (also referred to as a floating gate structure, storage gate structure, or simply a gate structure in the context of an FG cell according to some examples). Depending on the application and other device dimensions, the poly gate structure 106 may have a thickness ranging from about 50 nm to 150 nm, although other thicknesses may be used in additional and/or alternative implementations. After depositing an insulating layer covering the entire gate structure 106, insulating spacers 115 covering sidewalls of the gate structure 106 may be formed by etching back the insulating layer. In some examples, insulating spacers 115 may represent a composite spacer of two or more layers and/or dielectric materials. In some examples, insulating spacers 115 may be formed of a single layer/material. Regardless of how many layers are formed as part of insulating spacers 115, the layers may comprise various suitable dielectric materials such as silicon nitrides ($Si_XN_Y$), silicon oxynitrides ($Si_XO_YN_Z$), and silicon oxides ($Si_XO_Y$), wherein individual components such as silicon, oxygen, nitrogen, etc. may have various ratios, percentages, or compositions. After forming the spacers 115, source/drain regions 110/112 may be formed in the active region aligned to the FG structure 106.

Subsequent to FEOL processing, isolated devices including FG cells 104 may undergo appropriate BEOL fabrication steps for forming contacts, one or more levels of metal interconnects, inter-level vias, inter-level dielectric layers, etc., followed by a final passivation stage for forming a protective overcoat. In an example arrangement, BEOL fabrication flow may include silicidation of source/drain regions 110/112 as well as polysilicon regions, deposition and polishing of pre-metal dielectric (PMD) layers, e.g., a layer of silicate glass material such as a phosphosilicate glass (PSG) or borophosphosilicate glass (BPSG) that includes a silicon nitride layer over an oxide layer to isolate metal from silicon and polysilicon, and contact formation through the PMD layer for staging the process wafer for subsequent metallization steps. Depending on implementation, a metallization process may involve forming one or more metal conductor layers separated by corresponding inter-metal dielectric (IMD) layers. A particular combination of one or more metal conductor layers may be disposed in a conductive relationship by way of inter-level vias formed through the IMD layers at appropriate locations based on applicable interconnect routing. In some examples, a BEOL metallization process may involve providing metal layers at several levels (e.g., 10 or more metal layers), wherein some metal layers may be upper metal layers, some metal layers may be lower metal layers, and some metal layers may be intermediate-level metal layers. In some implementations, metal layers having a thickness of <1.0 μm may be considered thin layers, layers having a thickness of ≥1.0 μm may be considered thick layers, and layers having a thickness of ≥6.0 μm may be considered ultra thick layers.

Continuing to refer to FIG. 1, the cross-sectional view 100 of an example OTP FG cell is depicted with a PMD layer 199 including a nitride-based layer 114 that is formed over an oxide layer 118, wherein the nitride-based layer 114 and the oxide layer 118 may each comprise a respective thickness of several tens or hundreds of nanometers, while the PMD layer 199 may approach a thickness of ≥1.0 μm. In some arrangements, the nitride-based layer 114 may extend to the contacts formed in appropriate regions of the substrate 102, e.g., contacts 119A, 119B formed in the source/drain regions 110/112. For sake of simplicity and/or clarity, various metal layers as well as a final passivation overcoat (PO)/passivation layer that may be provided with respect to the example OTP FG cell are not shown in the cross-sectional view 100 of FIG. 1.

In some arrangements, a UV illumination process may be implemented at the end of BEOL processing as illustrated by UV illumination 155 having a suitable wavelength range (e.g., from 100 nm to 400 nm) and dosage range (e.g., 5-15 $J/cm^2$) that may be supplied by a plurality of UV light sources or tubes 150-1 to 150-N deployed in a suitable apparatus or equipment (e.g., a UV chamber) for erasing any charge that may have been accumulated in the storage gate structure 106 of the FG cell 104 during FEOL/BEOL stages. In some examples, UV illumination 155 may be applied before the formation of a PO layer in a final passivation stage. In some examples, UV illumination 155 may be applied even after passivation. Regardless of the BEOL stage at which the UV illumination 155 is applied, the incident UV photons may interact with the nitride material of the PMD layer, thereby creating charge traps 113 both in the nitride material disposed near the vicinity of the storage gate structure 106 as well as in the nitride material disposed near the vicinity of contact regions 117A/117B corresponding to contacts 119A/119B and unshown silicide in an example implementation. Such activation of nitride charge traps can negatively impact device data retention performance as well as contact integrity of an NVM device having FG cells such as, e.g., OTP storage cell 104, as previously set forth.

Turning to FIG. 2, reference number 200 shown therein generally refers to a cross-sectional view of a stacked gate storage element of an NVM bitcell (e.g., comprising any variety of erasable and programmable read only memory (EPROM) bitcells, including electrically erasable PROM (EEPROM), UV-erasable PROM (UV-PROM), or a Flash bitcells) that may be fabricated according to known or heretofore unknown processes. As with the cross-sectional view 100 of an example OTP cell shown in FIG. 1 described above, views of access/select transistors and/or other auxiliary transistors that may be associated with a stacked gate storage element, which may depend on the NVM bitcell architecture, are not shown in the cross-sectional view 200 of FIG. 2. In general, a stacked gate storage element or storage cell 204 may include a floating gate structure 206 and a control gate structure 207 that are separated by an inter-gate dielectric layer 257, wherein the floating gate structure 206 is operable for storing data. As such, the stacked gate storage cell 204 and associated source/drain regions 210/212 may be fabricated in a semiconductor substrate 202 using a suitable FEOL flow, which may be followed by a BEOL flow for forming contacts, metal interconnects, etc., that are roughly analogous to the processes set forth above. Accordingly, details with respect to the various FEOL/BEOL stages of a stacked gate NVM storage cell are not provided herein. Rather, a generalized view of a representative stacked gate NVM cell, e.g., storage cell 204, is set forth herein for purposes of some additional and/or alternative examples of the present disclosure. By way of illustration, a PMD layer 299 including a nitride-based layer 214 may be formed over an oxide layer 218 overlying the stacked gate structures 206/207, wherein spacers 215 and inter-gate dielectric layer 257 may be provided for electrical isolation. In some arrangements, spacers 215 and/or dielectric layer 257 may be formed of a nitride-based material. In some arrangements, the nitride-based layer 214 may extend to contacts areas 217A/217B defined in the substrate 202, e.g., diffusion areas 210/212 for forming contacts 219A/219B thereat. Skilled artisans will recognize that the thicknesses and/or compositions of the gate structures 206/207, PMD layer 299 as well as various constituent dielectric layers shown in the cross-sectional view 200 of FIG. 2 may vary depending upon the particular NVM cell architecture and implementation.

As with the fabrication of example OTP NVM described above, a UV illumination process may be implemented at the end of BEOL processing of a generalized stacked gate NVM, illustrated by UV illumination 255 having a suitable wavelength range and dosage range for the erasure of charge accumulated in the floating gate structure 206 during processing. A plurality of UV light sources or tubes 250-1 to 250-N deployed in a UV chamber may be illuminated for exposing the process wafer(s) having ICs with the stacked gate NVM over a configurable period of time. Depending on implementation, UV illumination 255 may be applied before or after the formation of a PO layer in a BEOL's final passivation stage. Similar to the UV-nitride interaction set forth above with respect to the OTP NVM example, UV-nitride interaction in the example stacked gate NVM may create charge traps 213 both in the nitride layer 214 disposed near the vicinity of the storage gate structure 206 as well as in the nitride-based inter-gate dielectric layer 257. Further, charge traps 213 may also be formed in the nitride material disposed near the vicinity of contact regions 217A/217B corresponding to contacts 219A/219B in an example implementation. As set forth above, charge trap formation in the nitride materials can negatively affect data retention of the floating gate structure 206 of the stacked gate NVM cell 204 as well as the integrity of the contact regions 217/217B, similar to the deleterious effects caused by the UV-nitride interaction in the example OTP NVM described previously.

Figure 3:
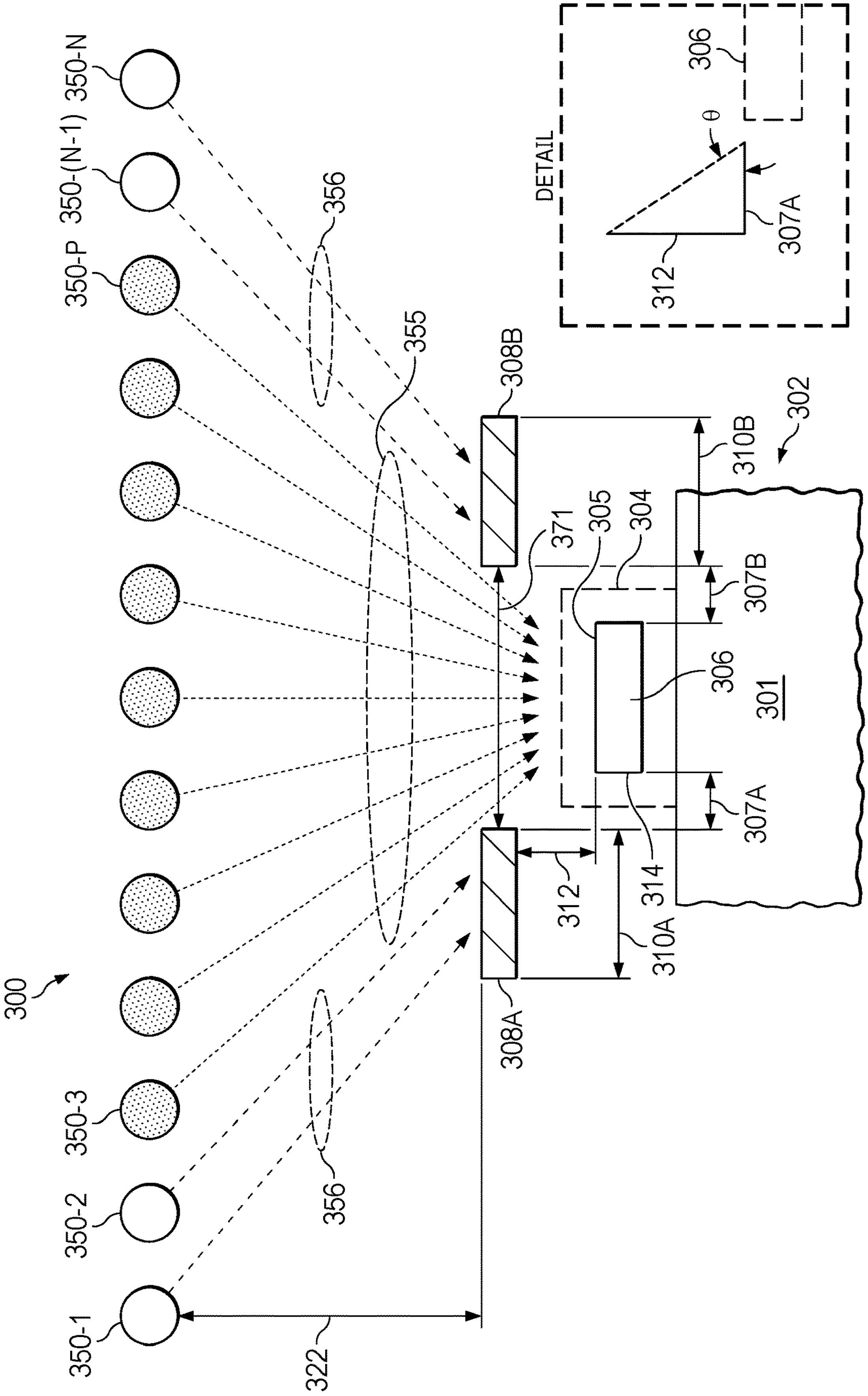
FIG. 3 depicts a UV erasure arrangement for charge removal in a representative FG cell having a UV-opaque layout pattern for modulating UV radiation exposure according to some examples of the present disclosure.

FIG. 3 depicts a UV erasure arrangement 300 for removing accumulated charge in a representative FG cell having a UV-opaque structural pattern relative to the geometry and topography of the FG cell, wherein various form-factor-related aspects of the UV-opaque structural pattern may be configured according to some examples of the present disclosure for modulating the amount of UV radiation reaching the FG cell. As illustrated, reference number 302 refers to a semiconductor process wafer having an IC, wherein a representative FG cell or transistor 304 is formed in a substrate 301 of the semiconductor process wafer 302, the representative FG cell 304 requiring exposure to UV illumination or radiation for erasing any charge accumulated therein due to processing. As set forth hereinabove, the FG cell 304 may be representative of single poly FG OTP cells, stacked gate NVM cells, etc., wherein at least one floating gate structure 306 is provided as a storage gate structure of the FG cell 304 that may accumulate charge during FEOL/BEOL processing. Further, it should be appreciated that although particular examples of single poly FG OTP cells and stacked gate NVM cells have been described above, the teachings of the present disclosure are not limited thereto. In additional and/or alternative arrangements, multi-gate OTP cell architectures, split-gate NVMs, etc., may also be provided with a suitable UV-opaque structural pattern according to some examples for modulating the amount of UV radiation reaching the FG cells so as to balance the dosage requirements for erasing the accumulated charge while minimizing, reducing, eliminating or otherwise mitigating the degradation in the data retention performance of the FG cell. Accordingly, the FG cell 304 shown in FIG. 3 is generally representative of any FG-based NVM storage cell wherein a storage gate structure, e.g., gate structure 306, may accumulate unwanted charge during processing, which is required to be removed by a UV erasure process.

In one arrangement, an example UV-opaque structural pattern 308A/308B may comprise one or more structural features that may be formed during the processing of the semiconductor wafer 302, e.g., in a BEOL stage, wherein the one or more structural features may at least partially surround but not overlap the gate structure 306 of the FG cell 304. The UV-opaque structural features may be sized and spatially positioned relative to the FG gate structure 306 so as to provide a "UV shadow" with respect to at least a portion of UV radiation emanating from one or more UV light sources, e.g., sources 350-1 to 350-N, of a UV erasure chamber (not specifically shown in this Figure) that is directed toward or generally incident upon the process wafer 302 including the FG cell 304. In one arrangement, the UV-opaque structural pattern 308A/308B may be formed of a metal layer at a particular metallization level that is not used for interconnecting an electrical terminal of the FG cell 304, although other metal layers may also be used in additional and/or alternative implementations and the metal layer may be used elsewhere in the device to interconnect other electrical components. Further, the structural pattern 308A/308B may also be formed of other UV-opaque or semi opaque materials (e.g., ceramic oxides) in some examples where such materials are used in a BEOL sequence. In some arrangements, lower-level metal layers (e.g., MET1 and MET2) may be used for interconnecting the terminals of a plurality of FG cells in an NVM array. Accordingly, upper-level metal layers comprising, e.g., MET3 or above, may be used for implementing a plurality of UV-opaque structural patterns 308A/308B corresponding to the plurality of FG cells of an example NVM array.

As the UV-opaque structural pattern 308A/308B may be positioned above and vertically spaced apart from a top surface 305 of the FG gate structure 306 by a vertical distance 312 that is orthogonal to the top surface 305, at least one of the constituent structural features thereof is operable to block the UV radiation emanating from one or more peripheral UV sources from reaching the FG gate structure 306, thereby effectuating a UV shadow adjacent or around the FG gate structure 306. As illustrated, structural feature 308A may operate to block radiation from UV sources 350-1 and 350-2, whereas structural feature 308B may operate to block radiation from UV sources 350-N and 350-(N−1), which may be referred to as the metal shadow effect in some arrangements where a metallic structure may be used for forming UV-opaque structural patterns 308A/308B. Although a symmetric blocking of UV illumination is illustrated in FIG. 3, different and/or asymmetrical UV blocking schemes may be effectuated depending on the orientation and alignment of the opaque structural pattern 308A/308B relative to the shape and orientation of the gate structure 306, as will be set forth further below. In example arrangements, the constituent structural features 308A and 308B may be provided at the same metal level, and as the vertical distance 312 increases, the radiation from more peripheral UV sources may be prevented from reaching the storage gate structure 306 depending on a number of factors such as, e.g., the vertical topography of FG cell 304, vertical distance 322 between a horizontal plane associated with the UV tubes 350-1 to 350-N and a horizontal plane associated with UV-opaque structural pattern 308A/308B, number of UV tubes 350-1 to 350-N, and/or inter-tube lateral spacing between the UV tubes 350-1 to 350-N, and the like.

Because the UV-opaque structural pattern 308A/308B is configured to not overlap the storage gate structure 306 of the FG cell 304, a configurable lateral spacing or horizontal distance 307A between an edge of an opaque structural feature, e.g., edge 309A of the feature 308A, and a corresponding edge 314 of the storage gate structure 306 that is parallel to the edge 309A, may be provided, which may be varied for modulating the amount of UV radiation, thus the dosage energy, reaching the storage gate structure 306. Depending on the number and construction of the constituent components, the opaque structural pattern 308A/308B may comprise a metal frame or structure having or otherwise defining an opening 371 that at least partially surrounds the storage gate structure 306 in some example arrangements, as will be set forth below. Further, also depending on the number and construction of the constituent components of the opaque structural pattern 308A/308B as well as the orientation and alignment of the constituent components relative to the shape and orientation of the gate structure 306, there may be multiple lateral spacings or distances, e.g., spacings 307A and 307B, along a horizontal plane of the storage gate structure 306 that may be independently varied to block different UV illumination portions, e.g., portions 356A and 356B, whereby only a select portion of UV illumination, e.g., portion 355, is incident upon the storage gate structure 306 for effectuating charge erasure. In an example arrangement, a vertical distance between the top surface 305 of the storage gate structure 306 and a bottom surface of the UV-opaque structural pattern 308A/308B, e.g., the vertical distance 312, also referred to as a first distance, may be greater than a lateral or horizontal distance between the storage gate structure 306 and the UV-opaque structural pattern 308A/308B, e.g., distance 307A, which may be referred to as a second distance.

In addition to the opaque structural pattern 308A/308B being amenable to be constructed in myriad ways relative to the shape and orientation of the gate structure 306, the lateral and vertical distances between the opaque structural pattern 308A/308B and the gate structure 306 may also be configured in numerous combinations for optimizing the amount of UV radiation reaching the gate structure 306 in a particular process setting. For example, a specific combination of the opaque structural pattern 308A/308B, lateral distances 307A/307B and vertical distances 312 may be configured so as to optimize the balance between the dosage required to ensure the erasure of accumulated charge in the gate structure 306 and the dosage that does not degrade the data retention performance of the gate structure 306 of the FG cell 304 may be obtained for a given NVM device architecture, fabrication flow, process tooling, etc. Generally, for example, as the lateral distance between the storage gate structure 306 and the UV-opaque structural pattern 308A/308B, e.g., distance 307A, is reduced, the amount of UV radiation reaching the storage gate structure 306 is also reduced, which may help reduce the nitride trap formation in the nitride layer(s) disposed in the vicinity of the storage gate structure 306, thereby improving the data retention performance of the FG cell 304. In some arrangements, appropriate relationships between UV dosages, lateral/vertical distances between the opaque structures and the FG cell's storage gate structure (e.g., for different form factors, configurations as well as various orientations and alignments therebetween), erasure characteristics with respect to the accumulated process charge, and data retention performance (e.g., as measured by data retention bake tests after programming the NVM device with suitable test data) may be obtained and quantified, which may be used in selecting and implementing a particular type/configuration of the opaque structural pattern involving a specific metal layer of the NVM device in an example implementation.

In some arrangements, a lateral distance (LD) between the FG storage structure 306 and UV-opaque structural pattern 308A, e.g., lateral distance 307A, may be configured to be less than approximately 20%, e.g., +3%, of a vertical distance (VD) between the FG storage structure 306 and the UV-opaque structural pattern 308A, e.g., vertical distance 312, for the metal shadow effect to be effective, e.g., in terms of achieving a balance between accumulated charge erasure characteristics and the programmed data retention performance, for a metal layer at a given metallization level that is used in a representative implementation of the present disclosure. In other words, an interior acute angle θ of a right-angled triangle formed by the lateral distance 307A and the vertical distance 312, as shown in a thumbnail portion designated "Detail" in FIG. 3, may be appropriately configured for achieving a suitable metal shadow effect in an example implementation, wherein 0 is defined as arctan(VD/LD) and relative to the horizontal plane of top surface 305 of the FG gate structure 306. In one arrangement, the interior acute angle θ may be configured to be greater than approximately 78° and less than 90° in some examples (e.g., the UV-opaque structural pattern 308A does not overhang or extend over the FG gate structure 306), for example within a range of 77° to 80°.

Because the FG cell 304 is one of a plurality of FG cells, typically organized in a bitcell array or some other suitable configuration, the UV-opaque structural pattern 308A/308B may comprise one of a plurality of metal structures corresponding to the plurality of FG cells of an example NVM device, as previously set forth. In one example arrangement, the UV-opaque structural patterns 308A/308B may form a metal frame surrounding a respective storage gate structure of the corresponding FG cell, wherein each metal frame may have a particular width 310A/310B. In some implementations, the storage gate structures 306 may have a rectangular shape, with a major axis and a minor axis, wherein each rectangular storage gate structure is surrounded by a corresponding opaque metal frame of appropriate form factor. In some arrangements, the corresponding opaque metal frames may be contiguously positioned so as to form a single sheet that may be fabricated as a unitary metal structure having a plurality of openings or apertures that are aligned over the respective FG structures of the corresponding FG cells, wherein an inside edge of an aperture surrounds but is spaced apart from a perimeter of edge of the FG structure by a lateral distance such as, e.g., distance 307A/307B.

Figure 4:
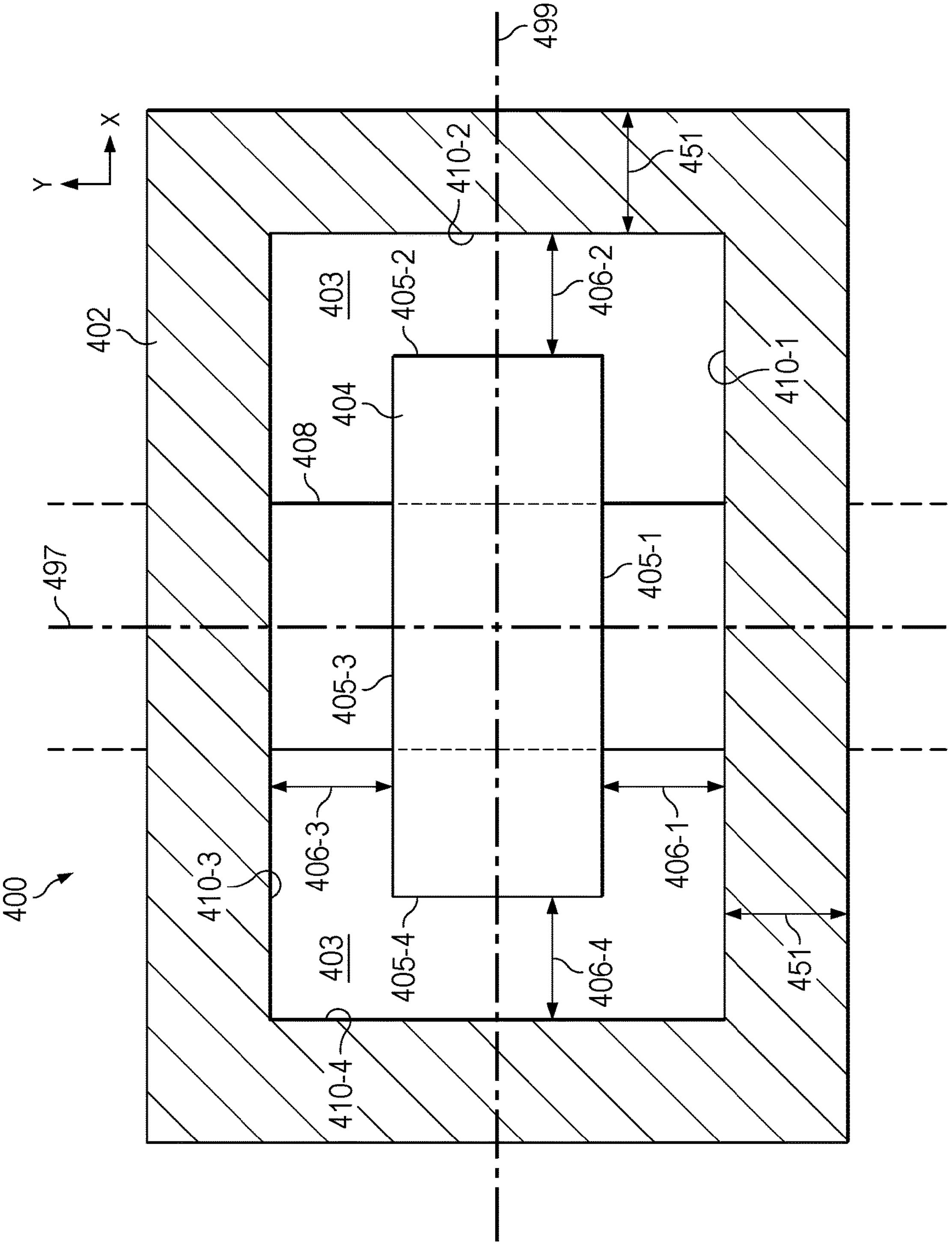
FIG. 4 depicts an example metal layout pattern configured to surround an FG cell at an upper-level metal layer according to some examples of the present disclosure.

FIG. 4 depicts a top plan view of an example layout portion 400 depicting a rectangular metal frame 402 defining an opening 403 that surrounds a rectangular storage gate structure 404 of an FG cell or transistor according to some examples of the present disclosure. Rectangular storage gate structure 404 has a major axis 499 and a minor axis 497 orthogonal to the major axis 499. In some arrangements, the major axis 499 may be parallel to or aligned along a first horizontal axis, e.g., the X-axis of a cartesian X-Y coordinate plane parallel to a surface of the semiconductor substrate in which the FG cell is formed (not shown in this Figure). In some arrangements, the major axis 499 may be parallel to or aligned along a second horizontal axis e.g., the Y-axis of a cartesian X-Y coordinate plane, wherein the second horizontal axis is orthogonal to the first horizontal axis. A bitline layout pattern 408 associated with the storage gate structure 404 may be disposed orthogonal to the major axis 499 of the storage gate structure 404. The rectangular metal frame 402 may have a uniform frame width 451, although some arrangements may have different/varying frame widths depending on implementation. In one arrangement, the rectangular metal frame 402 may symmetrically surround the rectangular gate structure 404 such that lateral distances between the perimeter of the gate structure 404 and an inside edge of metal frame 402 (i.e., defining the opening 403) along a first axis are the same and lateral distances along a second axis that is orthogonal to the first axis are the same. As illustrated, lateral distances 406-1 and 406-3 defined parallel to the minor axis 497 may therefore comprise a first horizontal distance measured between corresponding sides 405-1, 405-3 and inside edges 410-1, 410-3 of the metal frame 402. Likewise, lateral distances 406-2 and 406-4 defined parallel the major axis 499 may comprise a second horizontal distance measured between corresponding sides 405-2, 405-4 and inside edges 410-2, 410-4 of the metal frame 402. Skilled artisans will recognize that depending on symmetry and alignment between the rectangular metal frame 402 and the rectangular gate structure 404, lateral distances 406-1 to 406-4 may all have the same or different distances depending on implementation.

Figure 5:
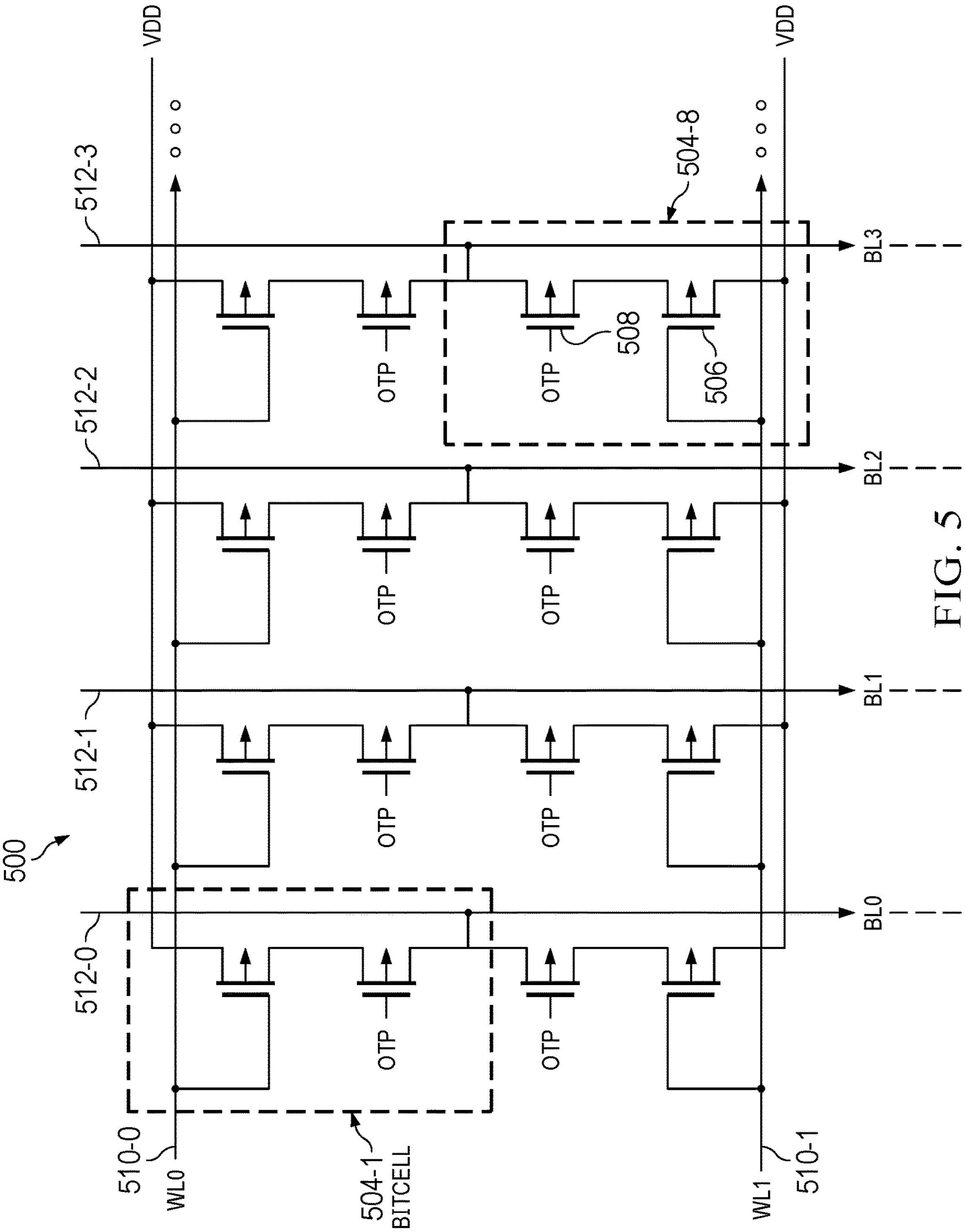
FIG. 5 depicts a circuit schematic diagram of a one-time programmable (OTP) bitcell array wherein a metal layout pattern may be provided with respect to the FG cells of the bitcell array for improved data retention according to some examples of the present disclosure.
Figure 8:
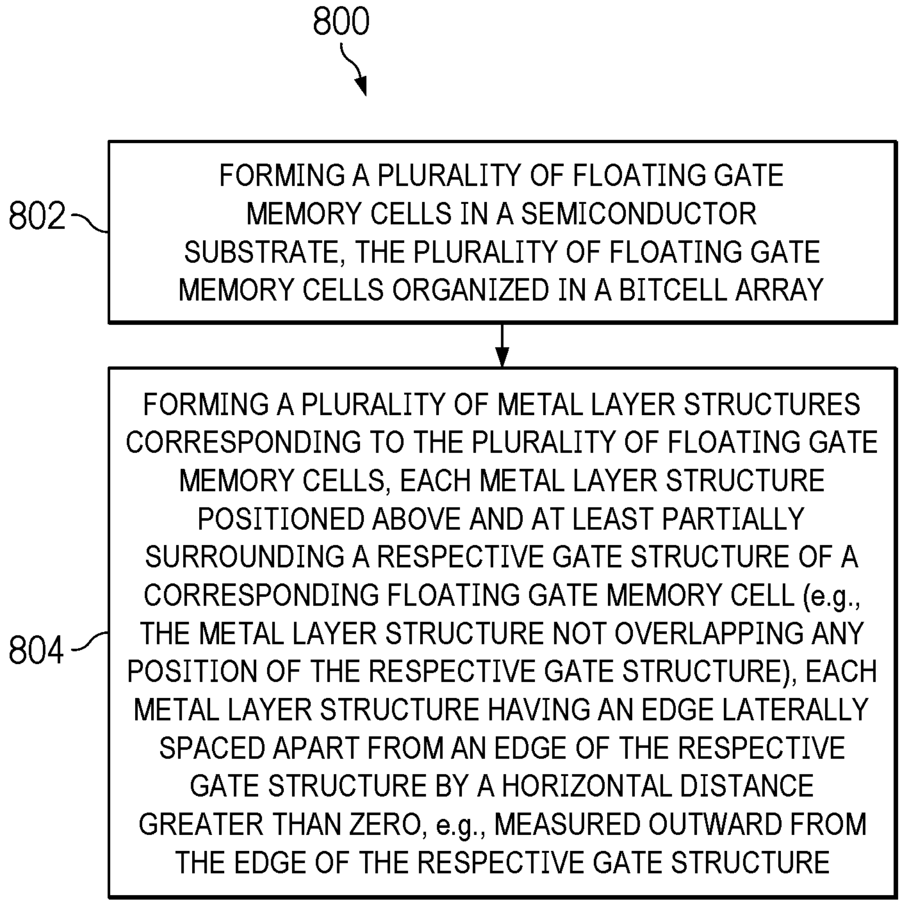
FIG. 8 is a flowchart relating to an IC fabrication method according to an example of the present disclosure.

Turning to FIG. 5, depicted therein is a circuit schematic diagram of an OTP bitcell array that may be fabricated as part of an IC having NVM, wherein a metal layout pattern may be provided with respect to the FG cells of the bitcell array for improved data retention according to some examples of the present disclosure. Bitcell array 500 may comprise a plurality of OTP bitcells interconnected together to form a matrix of {m} rows (e.g., wordlines) and {n} columns (e.g., bitlines), wherein of a sense amplifier circuitry (not shown in this Figure) may be coupled to the bitlines for effectuating OTP bitcell operations (e.g., read/write operations) under the control of wordline driver circuitry and control logic circuitry (not shown in this Figure). By way of example, eight PMOS-based OTP bitcells 504-1 to 504-8 organized in a 2-by-4 array portion having two wordlines 510-0, 510-1 and four bitlines 512-0 to 512-3 are illustrated in FIG. 8, wherein wordline WL0 510-0 is operable with respect to accessing a first row of OTP bitcells and wordline WL1 510-1 is operable with respect to accessing a second row of OTP bitcells. An example OTP bitcell, e.g., bitcell 504-8, may comprise an FG-based storage cell 508 coupled to a select transistor 506 driven by the corresponding wordline WL1 510-1.

Figure 6:
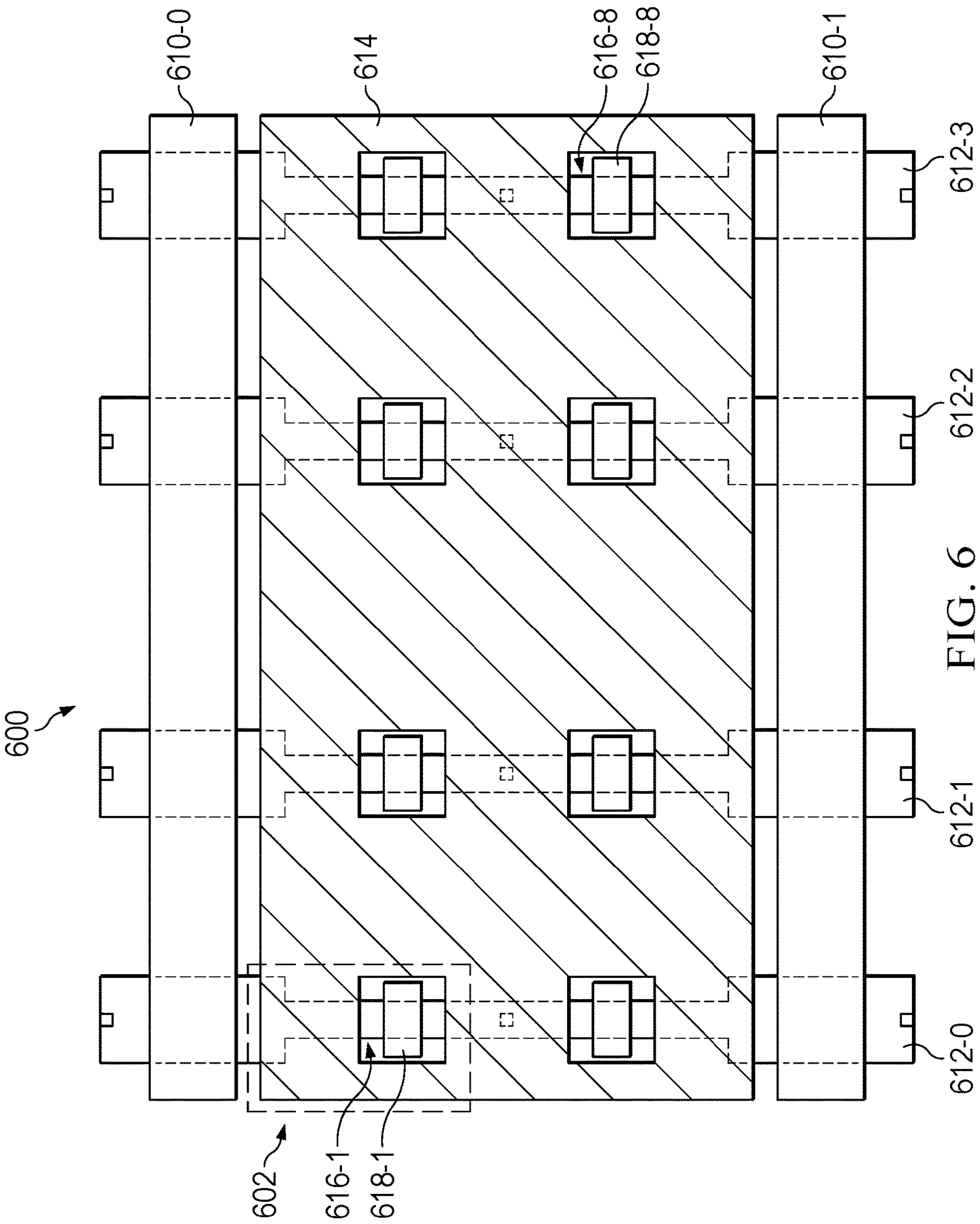
FIG. 6 depicts a layout corresponding to the OTP bitcell array circuit shown in FIG. 5 including a metal sheet structure having a plurality of apertures surrounding respective FG cells according to an example implementation.

FIG. 6 depicts a layout portion 600 corresponding to the OTP bitcell array 500 shown in FIG. 5 including a metal sheet structure 614 provided at a particular metallization level, wherein the metal sheet structure 614 has a plurality of apertures 616-1 to 616-8 surrounding respective FG features of 618-1 to 618-8 of corresponding OTP bitcells 504-1 to 504-8 according to an example implementation. Further, row layout features 610-0, 610-1 correspond to wordlines 510-0, 510-1 and column layout features 612-0 to 612-3 correspond to bitlines 512-0 to 5120-3 according to an example. By way illustration, FG feature 618-8 corresponds to the storage gate structure of the FG storage cell 508 of the OTP bitcell 504-8. By way of illustration, gate feature 618-8 is surrounded by aperture 616-8 of the metal sheet structure 614, wherein the lateral distance(s) between gate feature 618-8 and aperture 616-8 may be suitably configured to modulate the amount of UV radiation applied in a BEOL sequence for erasing the unwanted charge that may have been accumulated in the storage gate structure of the FG storage cell 508 during processing prior to the UV radiation stage.

Figure 7A:
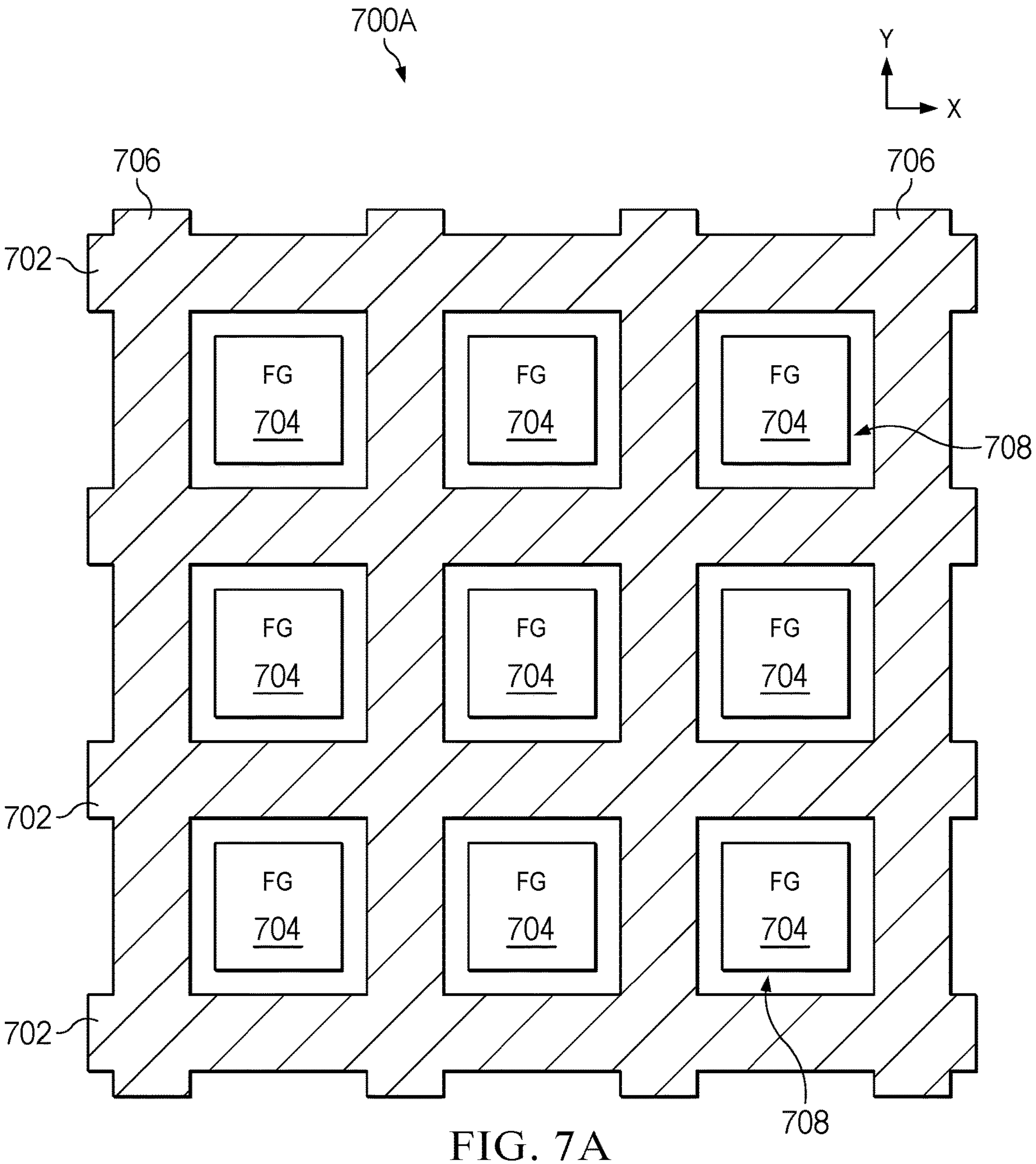
FIGS. 7A-7E depict example metal layout patterns for an IC having a plurality of FG cells according to some implementations.
Figure 7B:
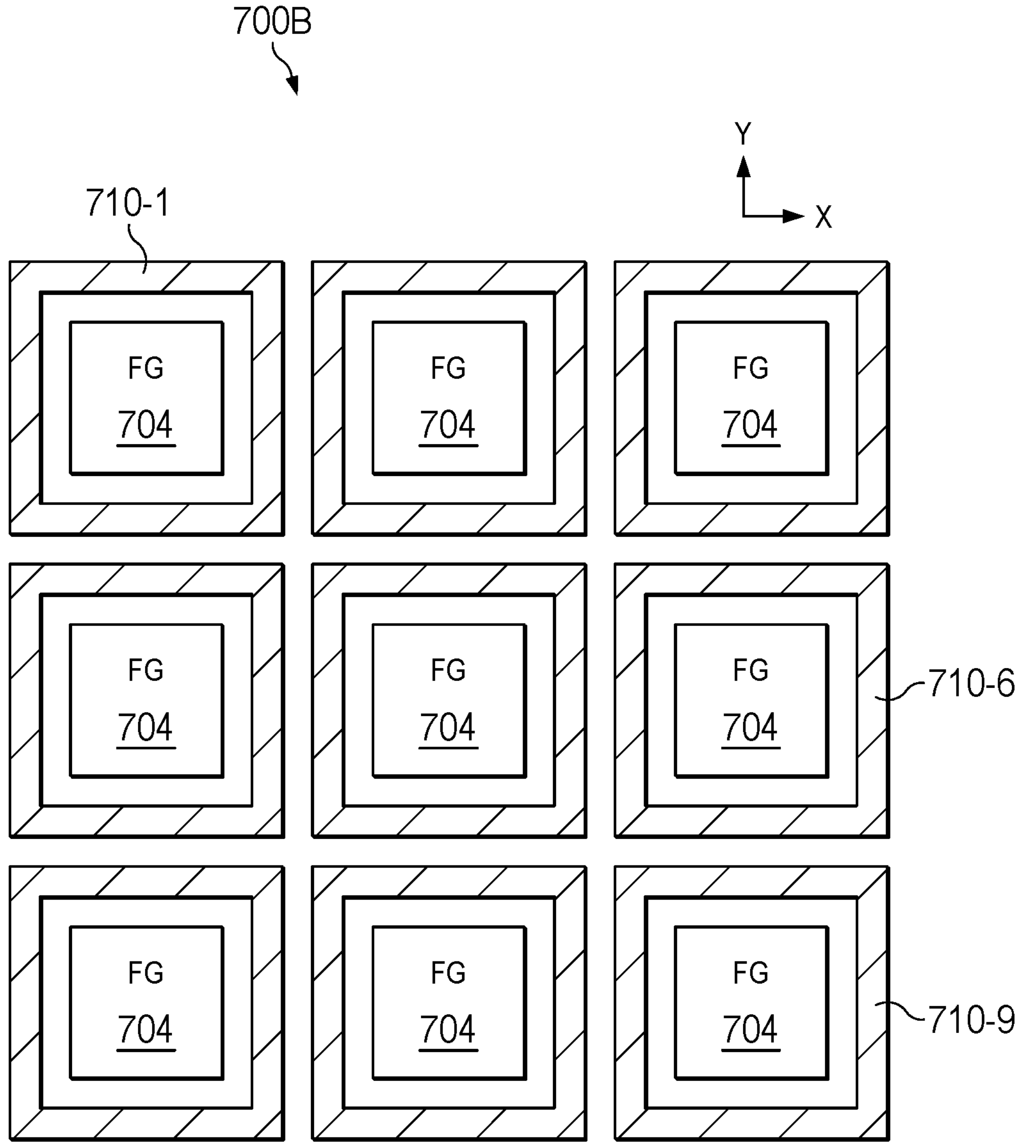

FIGS. 7A-7E depict example metal layout patterns for an IC having a plurality of FG cells 704 for modulating UV radiation dosages according to some implementations. At least some metal layout patterns illustrated herein may comprise one or more metallic structures formed of a metal layer at a particular metallization level that is not used for interconnecting electrical terminals the FG cells as previously noted. As set forth below, example metallic structures having various shapes, sizes, form factors, etc., generally referred to herein as metallic components, may be configured in myriad arrangements for achieving appropriate levels of UV dosage modulation by effectuating suitable metal shadow effects. It should be appreciated that FG cells 704 are symbolic representations of any FG-based NVM cells, e.g., single poly storage cells, stacked gate storage cells, etc., which may be associated with one or more additional transistors as part of a bitcell architecture that are not specifically shown in FIGS. 7A-7E. Further, an FG cell 704 may comprise a storage gate structure that may have a particular form factor, e.g., a rectangular shape, that is also not specifically shown in these Figures. Reference number 700A shown in FIG. 7A is illustrative of a metal grid pattern wherein a plurality metal strips 702 oriented along a first horizontal axis (e.g., X-axis) and a plurality of metal strips 706 oriented along a second horizontal axis (e.g., Y-axis) may be fabricated as a single planar structure for defining an array of apertures 708 therein relative to the respective storage gate structures of corresponding FG cells 704. In some arrangements, the metal grid pattern 700A may be implemented as a perforated metal sheet structure having the array of apertures or perforations 708, wherein the apertures may have any suitable shape, e.g., rectangles, squares, circles, polygonal shapes, rhombus/rhomboid shapes, elliptical/oval shapes, etc. FIG. 7B depicts a metal frame grid 700B comprising a plurality of metal frames 710-1 to 710-9, wherein each metal frame is configured to surround a respective storage gate structure of a corresponding FG cell 704. Although the metal frames 710-1 to 710-9 are shown as having a square shape, it should be appreciated that metal frames 710-1 to 710-9 may have a rectangular shape with major and minor axes, wherein the major axis may be oriented parallel to the X-axis or the Y-axis as noted previously. Further, the metal frames 710-1 and 710-9 may comprise additional forms and/or contours, such as, e.g., rings, ovals, racetracks, elliptical shapes, polygonal shapes, rhombus/rhomboid shapes, and the like. In still further arrangements, the width of the metal frames 710-1 and 710-9 may also vary across the grid 700B, e.g., along the X-axis or Y-axis, although it may be more beneficial to have a symmetrical arrangement with respect to the storage gate structures so that substantially uniform erasure characteristics (hence the uniform data retention performance may be obtained in the FG cells 704 of an IC device.

Figure 7C:
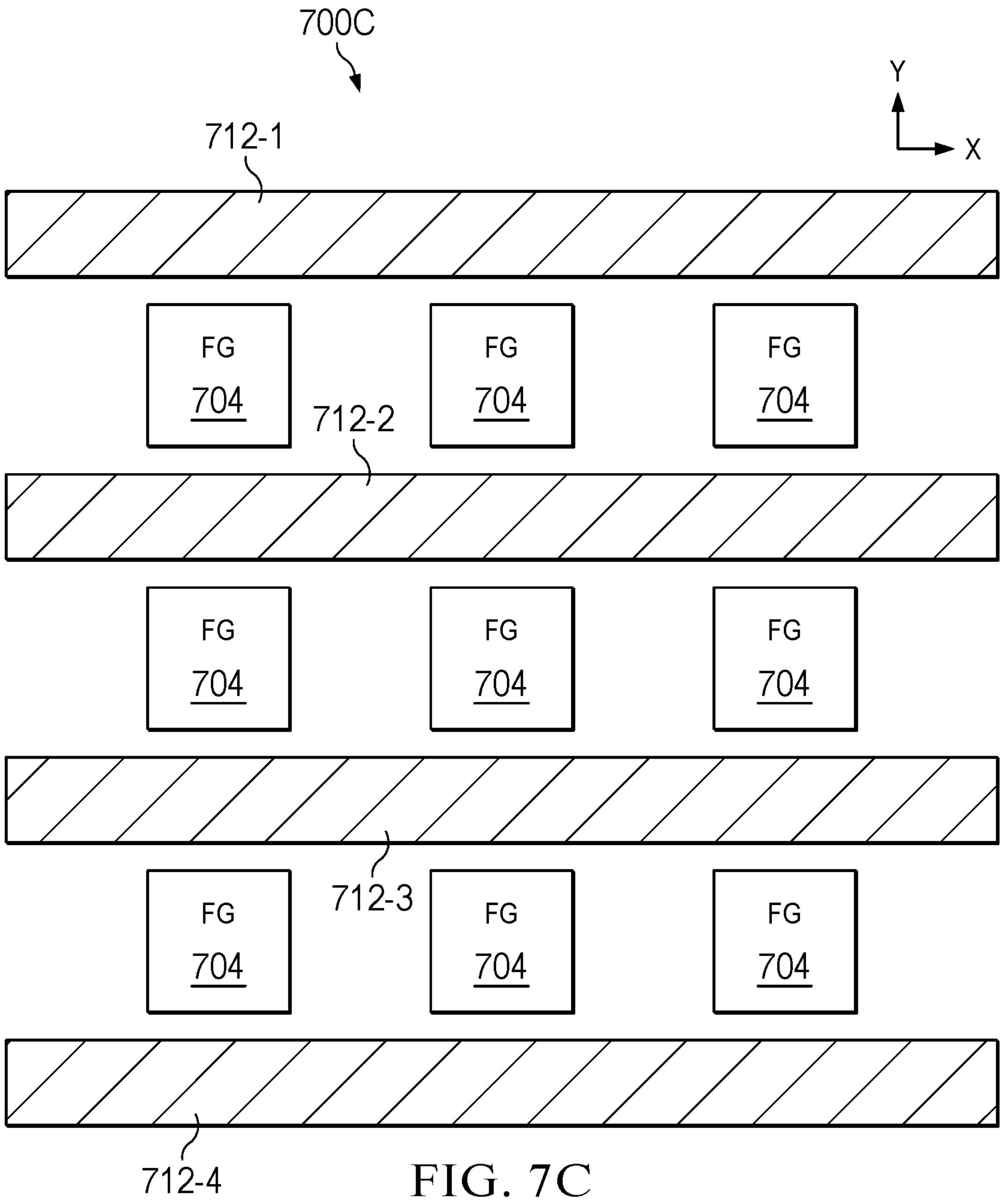
Figure 7D:
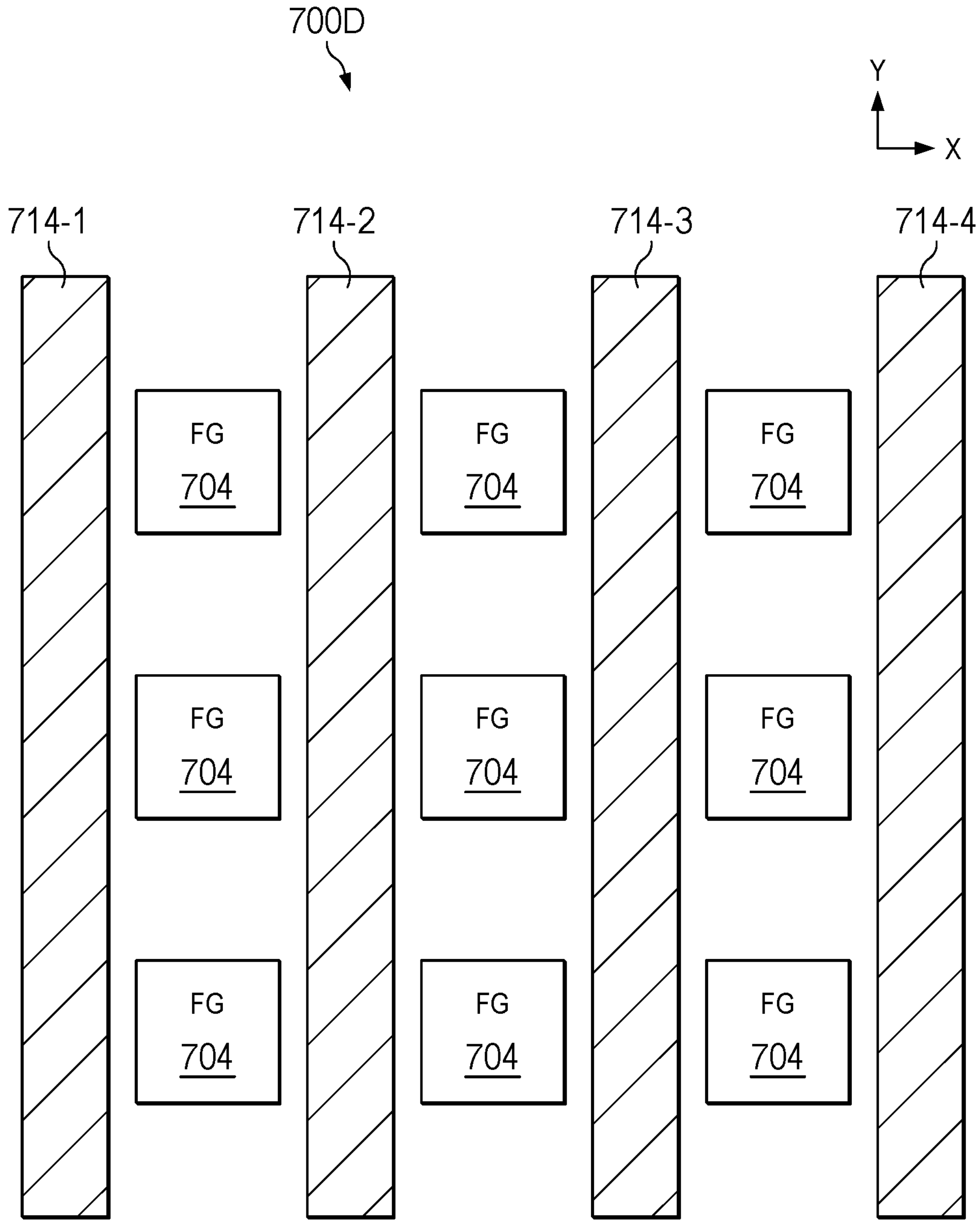
Figure 7E:
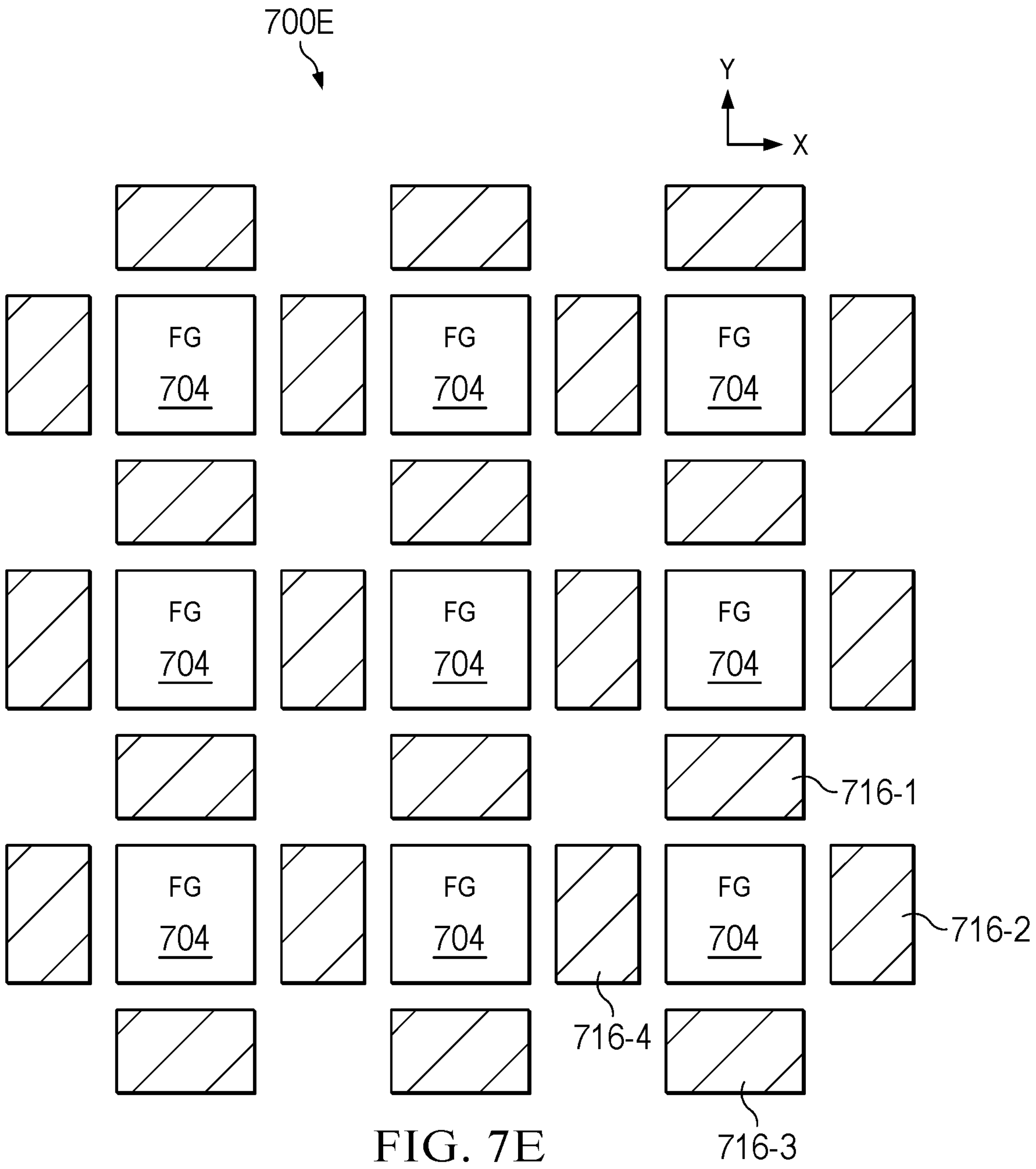

FIG. 7C depicts a metal strip pattern 700C for effectuating UV dosage modulation with respect to the FG cells 704, wherein a plurality of metal strips 712-1 to 712-4 may be formed that are oriented parallel to a horizontal axis, e.g., X-axis, that may be aligned with an axis of storage gate structures of the FG cells 704. In similar fashion, FIG. 7D depicts a metal strip pattern 700D with respect to the FG cells 704, wherein a plurality of elongated metal strips 714-1 to 714-4 may be formed that are oriented parallel to a horizontal axis, e.g., Y-axis, that may be aligned with an axis of storage gate structures of the FG cells 704. FIG. 7E depicts a metal segment pattern 700E wherein a plurality of noncontiguous rectangular metal segments may be disposed relative to the storage gate structures of the corresponding FG cells, respectively. Although the metal segment pattern 700E is shown as a grid of metal segments wherein metal segments are formed parallel to both X-axis and Y-axis, several variations may be obtained with respect to an example implementation. In one arrangement, metal segments may be formed only along a first direction, e.g., parallel to X-axis. In another arrangement, metal segments may be formed only along a second direction that is orthogonal to the first direction, e.g., parallel to Y-axis. Further, whereas the storage gate structure of an FG cell 704 may be surrounded by a respective metal segment on all sides in an example arrangement, e.g., as illustrated by metal segments 716-1 to 716-4, some variations may involve providing one or more metal segments only on specific sides of the storage gate structure. Skilled artisans will therefore recognize that various combinations of UV-opaque structural patterns comprising disjointed metal segments may be provided for purposes of some examples of the present disclosure.

FIG. 8 is a flowchart relating to an IC fabrication method 800 according to an example of the present disclosure. Method 800 may include forming a plurality of floating gate memory cells in a semiconductor substrate, wherein the plurality of floating gate memory cells may be organized in a bitcell array (block 802). A plurality of metal layer structures corresponding to the plurality of floating gate memory cells may be formed, e.g., comprising metal segments of a metal layer not used for interconnecting the floating gate memory cells, wherein each metal layer structure is positioned above and at least partially surrounds and does not overlap a respective storage gate structure of a corresponding floating gate memory cell (block 804). In one arrangement, the metal layer structures may be formed such that each metal layer structure has an edge laterally spaced apart from an edge of the respective gate structure by a horizontal distance greater than zero, e.g., measured outward from the edge of the respective gate structure as illustrated by lateral distances 307A/307B shown in the arrangement of FIG. 3. In some examples, the horizontal distance may be less than approximately 20% of a vertical distance, e.g., +3%, between a top surface of the respective gate structure and a corresponding metal layer structure as described previously, although other spatial arrangements may be implemented in some examples. As set forth above, the plurality of metal layer structures may be formed as metal frames having different shapes, sizes, widths, etc., surrounding the respective gate structures in some arrangements. In an example arrangement, the metal frames be formed to have a frame width greater than a vertical distance between the metal frame and a top surface the respective gate structure of the corresponding floating gate memory cell. In further arrangements, the plurality of metal layer structures may be formed as metal strips, segments, etc. that may be arranged in a variety of configurations, e.g., grid-like configurations, windowpane configurations, checkerboard configurations, etc. Further, the plurality of metal layer structures may be formed contiguously as a single unit, e.g., as a metal sheet structure, having a plurality of openings corresponding to the plurality of FG cells of the IC device.

In an example arrangement, each of the plurality of metal layer structures may be formed to be vertically spaced apart from a top surface of the respective gate structure of the corresponding floating gate memory cell by a vertical distance greater than the horizontal distance between the edge of each metal layer structure and the edge of the respective gate structure. In an example arrangement, the method 800 may further comprise forming a PMD layer including a silicon nitride layer formed over the plurality of floating gate memory cells. In an example arrangement, the vertical and horizontal distances between the metal layer structures and the respective storage gate structures may be controlled independently and/or in combination to optimize a UV dosage for erasing any accumulated charge in the storage gate structures without degrading the data retention performance of the IC device.

At least some examples are described herein with reference to one or more block diagrams and/or flowchart illustrations. It is understood that such diagrams and/or flowchart illustrations, and combinations of blocks in the block diagrams and/or flowchart illustrations, are susceptible to various modifications, variations and alterations, etc. In at least some additional or alternative implementations, the functions/acts described in the blocks may occur out of the order shown in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Also, some blocks in the flowcharts may be optionally omitted. Furthermore, although some of the diagrams include arrows on communication paths to show a primary direction of communication, it is to be understood that communication may occur in the opposite direction relative to the depicted arrows. Finally, other blocks may be added/inserted between the blocks that are illustrated.

It should therefore be clearly understood that the order or sequence of the acts, steps, functions, components or blocks illustrated in any of the flowcharts and/or block diagrams depicted in the drawing Figures of the present disclosure may be modified, altered, replaced, customized or otherwise rearranged within a particular flowchart or block diagram, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of practicing the teachings of the present disclosure.

At least some portions of the foregoing description may include certain directional terminology, which may be used with reference to the orientation of some of the Figures or illustrative elements thereof being described. Because components of some examples can be positioned in a number of different orientations, the directional terminology is used for purposes of illustration and is in no way limiting. Accordingly, although spatially relative terms, such as "beneath," "below," "lower," "above," "upper," "horizontal," "vertical" and the like, may have be used herein for ease of description to describe one element or feature's relationship to another element(s) or feature(s) as illustrated in the Figures, these spatially relative terms are intended to encompass different orientations of the device in use or operation in addition to the orientation depicted in the Figures. Likewise, references to features referred to as "first", "second", etc., are not indicative of any specific order, importance, and the like, and such references may be interchanged mutatis mutandis, depending on the context, implementation, etc. Further, the features of examples described herein may be combined with each other unless specifically noted otherwise.

Although various implementations have been shown and described in detail, the claims are not limited to any particular implementation or example. None of the above Detailed Description should be read as implying that any particular component, element, step, act, or function is essential such that it must be included in the scope of the claims. Where the phrases such as "at least one of A and B" or phrases of similar import are recited or described, such a phrase should be understood to mean "only A, only B, or both A and B." Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the claims appended below.

What is claimed is:

1. An integrated circuit, comprising:

a plurality of floating gate memory cells organized in a bitcell array extending into a semiconductor substrate; and a plurality of metal layer structures corresponding to the plurality of floating gate memory cells, each metal layer structure positioned above and at least partially surrounding a respective gate structure of a corresponding floating gate memory cell, each metal layer structure having an edge laterally spaced apart from an edge of the respective gate structure by a horizontal distance greater than zero measured outward from the edge of the respective gate structure and less than approximately 20% of a vertical distance between a top surface of the respective gate structure and a corresponding metal layer structure.

2. The integrated circuit as recited in claim 1, wherein the plurality of metal layer structures comprise metal components formed of a metal layer not used for interconnecting respective electrical terminals of the plurality of floating gate memory cells.

3. The integrated circuit as recited in claim 1, wherein the plurality of metal layer structures each comprise a metal frame surrounding the respective gate structure of the corresponding floating gate memory cell.

4. The integrated circuit as recited in claim 3, wherein each metal frame has a width greater than a vertical distance between the metal frame and the top surface of the respective gate structure of the corresponding floating gate memory cell.

5. The integrated circuit as recited in claim 1, wherein the bitcell array has first and second horizontal axes parallel to a top surface of the semiconductor substrate, the metal layer structures having rectangular metal segments each including a side parallel to a major axis of the respective gate structure of the corresponding floating gate memory cell.

6. The integrated circuit as recited in claim 5, wherein the rectangular metal segments are contiguously connected thereby forming an elongated metal strip oriented parallel to the first horizontal axis.

7. The integrated circuit as recited in claim 5, wherein the plurality of metal layer structures comprise rectangular metal segments aligned along the second horizontal axis.

8. The integrated circuit as recited in claim 7, wherein at least a portion of the rectangular metal segments are contiguously connected thereby forming an elongated metal strip oriented parallel to the second horizontal axis.

9. The integrated circuit as recited in claim 3, wherein the plurality of floating gate memory cells are one-time programmable (OTP) cells.

10. The integrated circuit as recited in claim 1, wherein the plurality of floating gate memory cells are stacked gate nonvolatile memory (NVM) cells.

11. A method of fabricating an integrated circuit, comprising:

forming a plurality of floating gate memory cells extending into a semiconductor substrate, the plurality of floating gate memory cells organized in a bitcell array; and forming a plurality of metal layer structures corresponding to the plurality of floating gate memory cells, each metal layer structure positioned above and at least partially surrounding a respective gate structure of a corresponding floating gate memory cell, each metal layer structure having an edge laterally spaced apart from an edge of the respective gate structure by a horizontal distance greater than zero measured outward from the edge of the respective gate structure and less than approximately 20% of a vertical distance between a top surface of the respective gate structure and a corresponding metal layer structure.

12. The method as recited in claim 11, wherein the plurality of metal layer structures comprise metal components formed of a metal layer not used for interconnecting respective electrical terminals of the plurality of floating gate memory cells.

13. The method as recited in claim 11, wherein the plurality of metal layer structures each comprise a metal frame surrounding the respective gate structure of the corresponding floating gate memory cell.

14. The method as recited in claim 13, wherein each metal frame has a width greater than a vertical distance between the metal frame and the top surface of the respective gate structure of the corresponding floating gate memory cell.

15. The method as recited in claim 11, wherein the bitcell array has first and second horizontal axes parallel to a top surface of the semiconductor substrate, the metal layer structures having rectangular metal segments each including a side parallel to a major axis of the respective gate structure of the corresponding floating gate memory cell.

16. The method as recited in claim 15, wherein the rectangular metal segments are contiguously connected thereby forming an elongated metal strip oriented parallel to the first horizontal axis.

17. The method as recited in claim 15, wherein the plurality of metal layer structures comprise rectangular metal segments aligned along the second horizontal axis.

18. The method as recited in claim 17, wherein at least a portion of the rectangular metal segments are contiguously connected thereby forming an elongated metal strip oriented parallel to the second horizontal axis.

19. The method as recited in claim 13, wherein the plurality of floating gate memory cells are one-time programmable (OTP) cells.

20. The method as recited in claim 11, wherein the plurality of floating gate memory cells are stacked gate nonvolatile memory (NVM) cells.

* * * * *